United States Patent
Silva

(10) Patent No.: US 8,975,523 B2
(45) Date of Patent: Mar. 10, 2015

(54) OPTIMIZED LITZ WIRE

(75) Inventor: Arturo Silva, Allen, TX (US)

(73) Assignee: Flextronics AP, LLC, Broomfield, CO (US)

( * ) Notice: Subject to any disclaimer, the term of this patent is extended or adjusted under 35 U.S.C. 154(b) by 351 days.

(21) Appl. No.: 12/473,497

(22) Filed: May 28, 2009

(65) Prior Publication Data

US 2009/0295531 A1 Dec. 3, 2009

Related U.S. Application Data

(60) Provisional application No. 61/056,706, filed on May 28, 2008.

(51) Int. Cl.
| | |
|---|---|
| *H01B 5/08* | (2006.01) |
| *H01F 3/14* | (2006.01) |
| *H01F 3/10* | (2006.01) |
| *H01F 27/34* | (2006.01) |
| *H01F 37/00* | (2006.01) |
| *H01F 17/00* | (2006.01) |
| *H05K 1/16* | (2006.01) |

(52) U.S. Cl.
CPC .. *H01F 3/14* (2013.01); *H01F 3/10* (2013.01); *H01F 27/346* (2013.01); *H01F 37/00* (2013.01); *H01F 2017/0093* (2013.01); *H05K 1/165* (2013.01)
USPC ...................................................... 174/128.2

(58) Field of Classification Search
USPC ........................................... 174/128.1, 128.2
See application file for complete search history.

(56) References Cited

U.S. PATENT DOCUMENTS

| | | | | |
|---|---|---|---|---|
| 931,542 | A | * | 8/1909 | Hertzberg ..................... 336/206 |
| 4,051,425 | A | | 9/1977 | Smith |
| 4,273,406 | A | | 6/1981 | Okagami |
| 4,490,690 | A | | 12/1984 | Suzuki |
| 4,642,588 | A | | 2/1987 | Kameya |
| 4,686,495 | A | | 8/1987 | Kameya |
| 4,695,812 | A | | 9/1987 | Kameya |

(Continued)

FOREIGN PATENT DOCUMENTS

| | | |
|---|---|---|
| CN | 2092848 U | 1/1992 |
| CN | 2650300 Y | 10/2004 |
| JP | 2008-159403 A | 7/2008 |

OTHER PUBLICATIONS

R. Colin Johnson, "Team claims Midrange Wireless Energy Transfer", EE Times.com, Nov. 20, 2006, 4 pages.

(Continued)

*Primary Examiner* — Chau N Nguyen
(74) *Attorney, Agent, or Firm* — Haverstock & Owens LLP

(57) ABSTRACT

A conductive cable for reducing the power losses in components, such as inductors and transformers. The conductive cable includes multiple strands that each include an inner conductor and an outer insulating layer. The conductive cable includes strands of multiple cross-sectional areas (multiple gauges), such that the power losses associated with the skin effect may be reduced. The cross-sectional areas of the strands of the conductive cable may be selected dependent upon the frequency content of the current that they are intended to carry. In the case of a PFC boost converter, the various cross-sectional areas of the strands may be selected to carry the harmonics of and AC power source, as well as higher frequency current caused by a switch associated with the PFC boost converter.

16 Claims, 6 Drawing Sheets

(56) References Cited

U.S. PATENT DOCUMENTS

| | | | |
|---|---|---|---|
| 4,695,933 A | 9/1987 | Nguyen et al. | |
| 4,712,160 A | 12/1987 | Sato et al. | |
| 4,788,626 A | 11/1988 | Neidig et al. | |
| 4,890,217 A | 12/1989 | Conway | |
| 4,893,227 A | 1/1990 | Gallios et al. | |
| 4,899,256 A | 2/1990 | Sway-Tin | |
| 4,975,821 A | 12/1990 | Lethellier | |
| 4,980,517 A * | 12/1990 | Cardas | 174/129 R |
| 5,038,264 A | 8/1991 | Steigerwald | |
| 5,101,322 A | 3/1992 | Ghaem et al. | |
| 5,164,657 A | 11/1992 | Gulczynski | |
| 5,235,491 A | 8/1993 | Weiss | |
| 5,262,932 A | 11/1993 | Stanley et al. | |
| 5,295,044 A | 3/1994 | Araki et al. | |
| 5,438,294 A | 8/1995 | Smith | |
| 5,490,052 A | 2/1996 | Yoshida et al. | |
| 5,517,755 A * | 5/1996 | Wright | 29/843 |
| 5,565,761 A | 10/1996 | Hwang | |
| 5,565,781 A | 10/1996 | Dauge | |
| 5,592,128 A | 1/1997 | Hwang | |
| 5,673,185 A | 9/1997 | Albach et al. | |
| 5,694,030 A | 12/1997 | Sato et al. | |
| 5,712,772 A | 1/1998 | Telefus et al. | |
| 5,742,151 A | 4/1998 | Hwang | |
| 5,747,977 A | 5/1998 | Hwang | |
| 5,786,687 A | 7/1998 | Faulk | |
| 5,798,635 A | 8/1998 | Hwang et al. | |
| 5,804,950 A | 9/1998 | Hwang et al. | |
| 5,811,895 A | 9/1998 | Suzuki et al. | |
| 5,818,207 A | 10/1998 | Hwang | |
| 5,870,294 A | 2/1999 | Cyr | |
| 5,894,243 A | 4/1999 | Hwang | |
| 5,903,138 A | 5/1999 | Hwang et al. | |
| 5,905,369 A | 5/1999 | Ishii et al. | |
| 5,920,466 A | 7/1999 | Hishara | |
| 5,923,543 A | 7/1999 | Choi | |
| 5,929,734 A | 7/1999 | Weiner | |
| 6,058,026 A | 5/2000 | Rozman | |
| 6,069,803 A | 5/2000 | Cross | |
| 6,078,010 A * | 6/2000 | Funahashi et al. | 174/126.1 |
| 6,091,233 A | 7/2000 | Hwang et al. | |
| 6,091,611 A | 7/2000 | Lanni | |
| 6,160,725 A | 12/2000 | Jansen | |
| 6,272,015 B1 | 8/2001 | Mangtani | |
| 6,282,092 B1 | 8/2001 | Okamoto et al. | |
| 6,326,740 B1 | 12/2001 | Chang et al. | |
| 6,341,075 B2 | 1/2002 | Yasumura | |
| 6,344,980 B1 | 2/2002 | Hwang et al. | |
| 6,366,483 B1 | 4/2002 | Ma et al. | |
| 6,396,277 B1 | 5/2002 | Fong et al. | |
| 6,407,514 B1 | 6/2002 | Glaser et al. | |
| 6,437,249 B1 * | 8/2002 | Higashiura et al. | 174/120 R |
| 6,469,914 B1 | 10/2002 | Hwang et al. | |
| 6,469,980 B1 | 10/2002 | Takemura et al. | |
| 6,483,281 B2 | 11/2002 | Hwang | |
| 6,487,095 B1 | 11/2002 | Malik et al. | |
| 6,531,854 B2 | 3/2003 | Hwang | |
| 6,541,944 B2 | 4/2003 | Hwang | |
| 6,583,999 B1 | 6/2003 | Spindler et al. | |
| 6,605,930 B2 | 8/2003 | Hwang | |
| 6,624,729 B2 | 9/2003 | Wright et al. | |
| 6,657,417 B1 | 12/2003 | Hwang | |
| 6,661,327 B1 | 12/2003 | Funk | |
| 6,671,189 B2 | 12/2003 | Jansen et al. | |
| 6,674,272 B2 | 1/2004 | Hwang | |
| 6,765,298 B2 | 7/2004 | Chin et al. | |
| 6,831,846 B2 | 12/2004 | Yasumura | |
| 6,879,237 B1 | 4/2005 | Viarouge et al. | |
| 6,958,920 B2 | 10/2005 | Mednik et al. | |
| 6,970,366 B2 | 11/2005 | Apeland et al. | |
| 7,035,126 B1 | 4/2006 | Lanni | |
| 7,038,406 B2 | 5/2006 | Wilson | |
| 7,047,059 B2 | 5/2006 | Avrin et al. | |
| 7,064,497 B1 | 6/2006 | Hsieh | |
| 7,167,384 B2 | 1/2007 | Yasumura | |
| 7,212,420 B2 | 5/2007 | Liao | |
| 7,230,835 B1 | 6/2007 | Ahmad | |
| 7,286,374 B2 | 10/2007 | Yasumura | |
| 7,286,376 B2 | 10/2007 | Yang | |
| 7,289,329 B2 | 10/2007 | Chen et al. | |
| 7,301,785 B2 | 11/2007 | Yasumura | |
| 7,321,285 B2 | 1/2008 | Hung et al. | |
| 7,324,354 B2 | 1/2008 | Joshi et al. | |
| 7,339,801 B2 | 3/2008 | Yasumura | |
| 7,375,608 B2 | 5/2008 | Suzuki et al. | |
| 7,388,762 B2 | 6/2008 | Yasumura | |
| 7,420,451 B2 | 9/2008 | Lee | |
| 7,423,887 B2 | 9/2008 | Yasumura | |
| 7,450,388 B2 | 11/2008 | Beihoff et al. | |
| 7,499,301 B2 | 3/2009 | Zhou | |
| 7,570,497 B2 | 8/2009 | Jacques et al. | |
| 7,583,513 B2 | 9/2009 | Boggs et al. | |
| 7,639,520 B1 | 12/2009 | Zansky et al. | |
| 7,764,515 B2 | 7/2010 | Jansen et al. | |
| 7,989,895 B2 | 8/2011 | White et al. | |
| 2002/0011823 A1 | 1/2002 | Lee | |
| 2002/0092668 A1 * | 7/2002 | Groegl et al. | 174/105 R |
| 2003/0034743 A1 * | 2/2003 | Chen | 315/247 |
| 2003/0035303 A1 | 2/2003 | Balakrishnan et al. | |
| 2004/0016117 A1 | 1/2004 | Wyrzykowska et al. | |
| 2004/0037050 A1 | 2/2004 | Nakayama et al. | |
| 2004/0040744 A1 | 3/2004 | Wyrzykowska et al. | |
| 2004/0056749 A1 | 3/2004 | Kahlmann et al. | |
| 2004/0072467 A1 | 4/2004 | Jordan et al. | |
| 2004/0150970 A1 | 8/2004 | Lee | |
| 2004/0228153 A1 | 11/2004 | Cao et al. | |
| 2005/0029013 A1 | 2/2005 | Lee | |
| 2005/0041976 A1 | 2/2005 | Sun et al. | |
| 2005/0063166 A1 | 3/2005 | Boggs et al. | |
| 2005/0073818 A1 | 4/2005 | Hirano et al. | |
| 2005/0105224 A1 | 5/2005 | Nishi | |
| 2005/0281425 A1 | 12/2005 | Greuet et al. | |
| 2006/0176719 A1 | 8/2006 | Uruno et al. | |
| 2006/0284697 A1 | 12/2006 | Lin et al. | |
| 2006/0289196 A1 * | 12/2006 | Lee et al. | 174/110 R |
| 2007/0007933 A1 | 1/2007 | Chan et al. | |
| 2007/0180684 A1 | 8/2007 | Wada et al. | |
| 2007/0192559 A1 | 8/2007 | Betsui | |
| 2007/0236967 A1 | 10/2007 | Liu et al. | |
| 2008/0174396 A1 | 7/2008 | Choi et al. | |
| 2008/0245556 A1 | 10/2008 | Bird et al. | |
| 2008/0250373 A1 | 10/2008 | Bird et al. | |
| 2009/0014206 A1 | 1/2009 | Motohashi et al. | |
| 2009/0015345 A1 | 1/2009 | Kushta et al. | |
| 2009/0045889 A1 | 2/2009 | Goergen et al. | |
| 2009/0152963 A1 | 6/2009 | Winkler et al. | |
| 2009/0224785 A1 | 9/2009 | Breinlinger et al. | |
| 2009/0231887 A1 | 9/2009 | Ye et al. | |
| 2009/0290384 A1 | 11/2009 | Jungreis | |
| 2009/0290385 A1 | 11/2009 | Jungreis | |
| 2010/0071948 A1 | 3/2010 | Wei | |

OTHER PUBLICATIONS

R. Colin Johnson, "Wireless Beacon Could Recharge Consumer Devices", EE Times.com, Jan. 11, 2007, 3 page.

Hang-Seok Choi et al. "Novel Zero-Voltage and Zero-Current-Switching (ZVZCS) Full-Bridge PWM Converter Using Coupled Output Inductor", Sep. 2002 IEEE, pp. 641-648.

Juan Rivas et al. "New Architectures for Radio-Frequency dc/dc Power Conversion", Laboratory for Electromagnetic and Electronic Systems, Massachusetts Institute of Technology, Jan. 2004, pp. 4074-4084.

Scollo P. Fischera R., "Electronic Transformer for a Halogen Lamp", ST Microelectronics, Jan. 1999, pp. 1-4.

* cited by examiner

OPTIMIZED LITZ WIRE

CROSS-REFERENCE TO RELATED APPLICATION

This application claims priority under 35 U.S.C. 119 to U.S. Provisional Application No. 61/056,706, entitled: "TECHNIQUES FOR POWER CONVERSION," filed on May 28, 2008, the contents of which are incorporated herein as if set forth in full.

BACKGROUND

Many electronic components such as power converters utilize wires or cables to carry voltage and/or current from one point in a circuit to another. Generally, these wires may be constructed from a conductive material (e.g., copper), which has a resistance to current flow that may contribute to power loss (sometimes called "copper loss") in an electronic component. Therefore, it may be desirable to minimize the power loss in the conductors in order to provide more efficient components.

Generally, the resistance of a conductor at DC (0 Hertz) depends on its cross sectional area. A conductor with a larger cross sectional area has a lower resistance than a conductor with a smaller cross sectional area. For AC current, a phenomenon known as the "skin effect" causes that resistance to increase substantially with increasing frequency of current.

The skin effect is the tendency of an AC electric current to distribute itself within a conductor such that the current density (i.e., current per cross-sectional area) near the surface of the conductor is greater than at its core. In other words, the current tends to flow at the "skin" of the conductor. The skin effect is due to eddy currents formed by the AC current. The decline in current density verses depth from the surface is often quantified by a measure of the distance from the surface of the conductor over which the current density decays to 1/e (or about 37%) of its value at the surface. This measure is generally referred to as "skin depth."

For low frequencies, the skin effect may be negligible. For AC current at frequencies high enough that the skin depth is small compared to the conductor diameter, the skin effect causes most of the conduction to happen at the conductor's surface. At high enough frequencies, the interior of a large conductor does not carry much current. As an example, at 60 Hz, the skin depth of a copper wire is about 0.3 inches (8 mm). At 60 kHz, the skin depth of copper is about 0.01 inches (0.254 mm). At 6 MHz, the skin depth is about 0.001 inches (25.4 μm). As can be appreciated, conductors larger than a few skin depths do not conduct much current near their interior axis, so that material isn't used effectively.

A type of cable called bunched wire or litz wire (from the German litzendraht, braided wire) may be used to mitigate the skin effect for current with relatively high frequencies, such as a few kilohertz, a few megahertz, or more. A cross-sectional view of a litz wire 10 is shown in FIG. 1. The litz wire 10 includes a number of insulated wire strands 15 woven together in a pattern (e.g., twisted, braided, or the like), so that the overall magnetic field acts substantially equally on all the strands and causes the total current to be distributed equally among them. Further, the radius of the individual strands may be chosen to be less than a skin-depth for a particular application, so the individual strands do not suffer an appreciable skin effect loss. The individual strands generally include an outer layer of insulation 16 to electrically insulate them from each other, such that the strands in a bundle are not shorted together. Further, the entire bundle of strands 15 may include an outer insulation layer 25.

Litz wire may be used in the windings of high-frequency transformers, to increase their efficiency by mitigating both skin effect and another phenomenon referred to as proximity effect, which is caused by an interaction of magnetic fields between multiple conductors. The weaving or twisting pattern of litz wire may be selected so that individual wires will reside for short intervals on the outside of cable and for short intervals on the inside of the cable, which may allow the interior of the litz wire to contribute to the cable's conductivity.

Undesirably, standard litz wire may reduce the effective copper area (relative to a solid conductive wire) since the insulation on each of the smaller individual wire strands consumes a significant amount of the net cross-sectional area of the litz wire. Furthermore, the packing of equally sized round strands next to each other leaves a relatively large percentage of the cross-sectional area taken by air space. Standard litz wire therefore results in relatively small amounts of copper in the cross-sectional area of the wire compared with standard wire of the same cross-sectional area.

SUMMARY

The following embodiments and aspects of thereof are described and illustrated in conjunction with systems, tools, and methods which are meant to be exemplary and illustrative, and not limiting in scope. In various embodiments, one or more of the above-described problems have been reduced or eliminated, while other embodiments are directed to other improvements.

According to a first aspect, a conductive cable that is operative conduct current having a plurality of frequency components is provided. The conductive cable includes a plurality of strands each including an inner conductor and an outer insulating layer, wherein at least one of the plurality of strands has a cross-sectional area that is different than a cross-sectional area of another of the plurality of strands.

According to a second aspect, a method for providing a conductive cable is disclosed. The method includes providing a first set of one or more strands that include an inner conductor and an outer insulating layer, the inner conductor having a first cross-sectional area, and providing a second set of one or more strands that include an inner conductor and an outer insulating layer, the inner conductor having a second cross-sectional area different than the first cross-sectional area. The method further includes coupling the ends of the first set of strands and the second set of strands together to form a conductive cable. In addition, the first and second cross-sectional areas are sized to efficiently conduct current having multiple frequency components.

According to a third aspect, a magnetic component is provided. The magnetic component includes a core, and a conductive cable wrapped around at least a portion of the core. The conductive cable includes a plurality of strands each including an inner conductor and an outer insulating layer, wherein at least one of the plurality of strands has a cross-sectional area that is different than a cross-sectional area of another of the plurality of strands.

In addition to the exemplary aspects and embodiments described above, further aspects and embodiments will become apparent by reference to the drawings and by study of the following descriptions.

DETAILED DESCRIPTION

Figure 1:
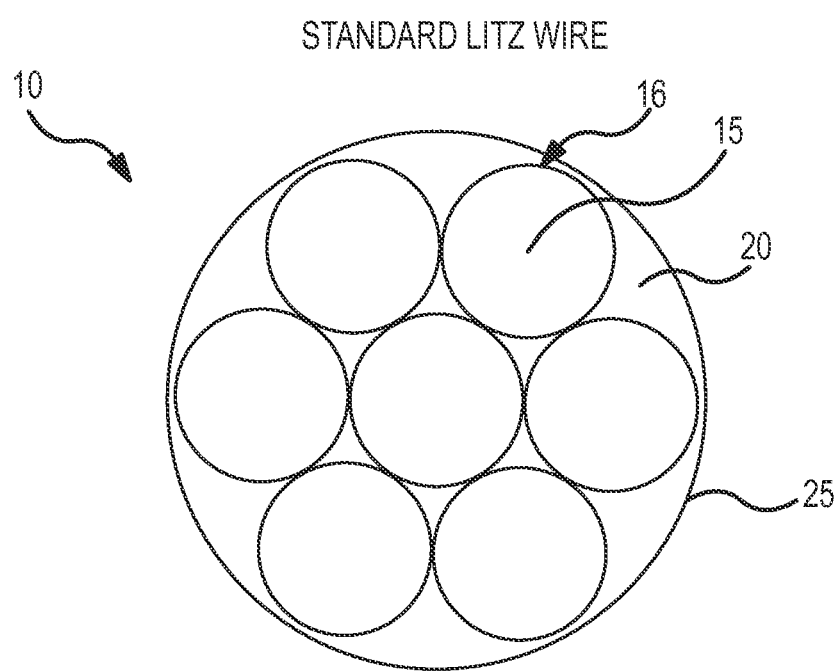
FIG. 1 illustrates a cross-sectional view of a prior art litz wire.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as defined by the claims.

In the following discussion, systems and methods for providing an optimized litz wire are explored. First, with reference to FIG. 4, a PFC boost converter in which the features described herein may be used is described. It will be appreciated that a discussion of this particular application is provided for explanatory purposes, and that the systems and methods for providing optimized litz wires may be applicable in other application. Next, with reference to FIGS. 5-6, exemplary embodiments of optimized litz wires are described.

Electronic devices such as notebook computers, desktop computers, monitors, and the like typically receive power from an AC power source. However, in most instances, the devices require DC power to operate, so the power from the AC power source must converted to DC power. The simplest way to accomplish this is by diode rectification circuitry. In this type of circuit, diodes are positioned in a circuit so that AC current flows in only one direction, so that the output of the rectifier maintains a non-negative voltage. This method is typically the least expensive AC-DC conversion scheme, but it also creates the most noise or "pollution" on the AC power network. This is the case because when a power converter is coupled to loads that are not purely resistive (e.g., reactive loads that include capacitors and inductors), the current drawn from the AC power source may be out of phase with the AC voltage, which may lead to increased harmonics. Therefore, if used in large numbers, devices that use this method can greatly impact the quality of the AC power line. Additionally, reactive loads cause power converters to be less efficient. Energy stored in the reactive loads results in a time difference between the current and voltage waveforms. This stored energy returns to the power source and is not available to do work at the load, so the "real power" of the circuit is less than the "apparent power." The ratio of real power to apparent power is generally referred to as the power factor of a circuit. As can be appreciated, a circuit with a low power factor will be required to draw greater current to transfer a given quantity of real power than a circuit with a high power factor, which translates to increased losses in power distribution systems and increased energy costs. Hence, it is often desirable to provide AC-to-DC power conversion that does not have these same shortcomings.

To achieve this, a power converter that includes power factor correction (PFC) circuitry may be used. Generally, PFC circuits have the function of maintaining the AC current substantially in phase with the AC voltage, so that the power converter resembles a purely resistive load to the AC power source, which reduces the pollution on the AC power line and increases the efficiency of the power converter. One type of PFC circuit is generally referred to as a passive PFC circuit. Passive PFC circuits perform power factor correction with only passive components, such as inductors and capacitors. Passive PFC circuits are typically robust and effective, but it is often difficult to reduce the distortion to acceptable levels. Furthermore, since passive PFC circuits operate at the relatively low line frequency (e.g., A typical AC power source operates at 50 Hz or 60 Hz), the inductors and capacitors required may be large in size and costly.

Another type of PFC circuit is generally referred to as an active PFC circuit. Active PFC circuits generally have at least one switch. The most commonly used active PFC circuit is based on a boost converter, which is included in a PFC circuit 50 shown in FIG. 2. The PFC circuit 50 operates to shape the input current to achieve low distortion levels. Due to the use of relatively higher switching frequencies (e.g., 50 kHz to 300 kHz), the size of the associated passive components required is significantly reduced when compared to passive PFC circuits.

Figure 2:
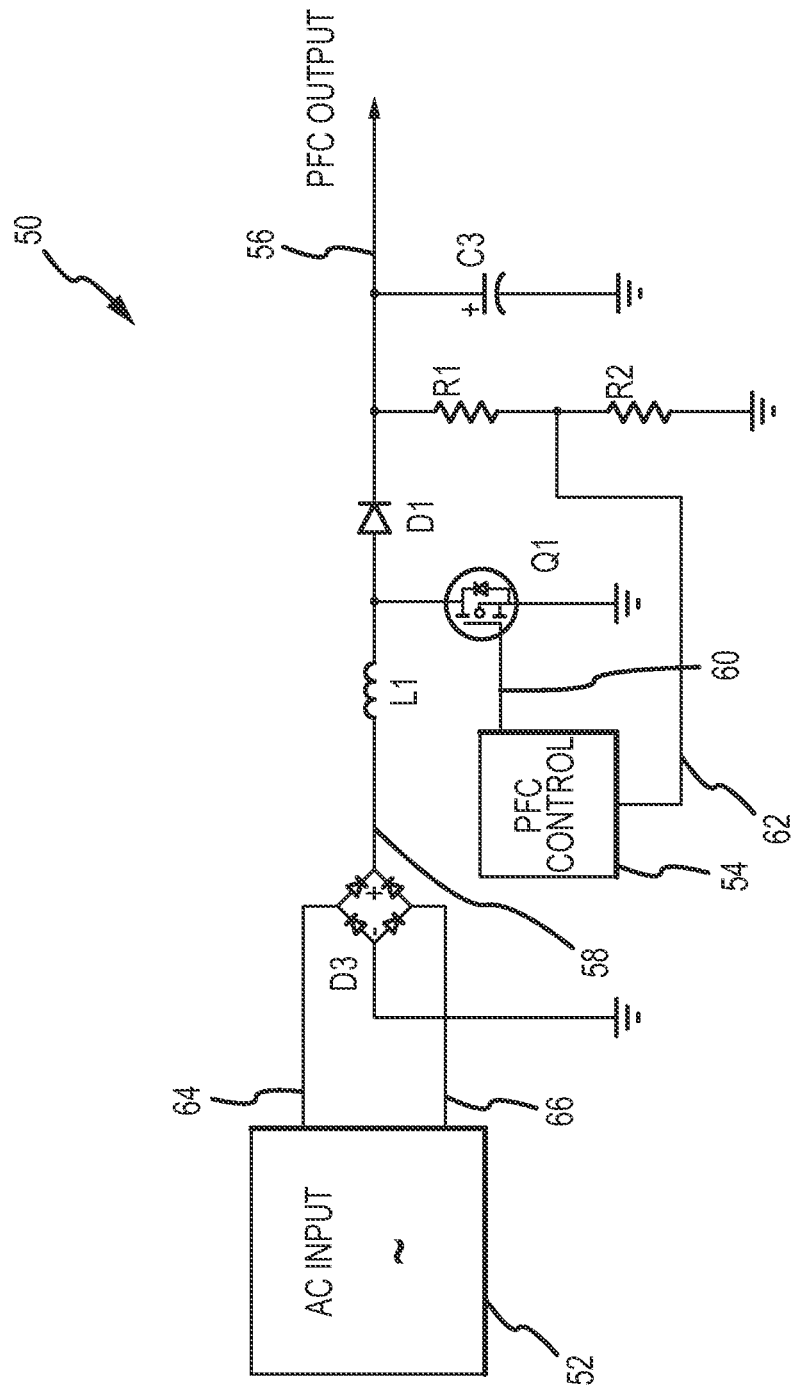
FIG. 2 illustrates an example of a PFC boost converter circuit that include an inductor that may include an optimized litz wire.

The structure of the active PFC circuit 50 is now described with reference to FIG. 2. As can be seen, an AC power source 52 is coupled across the input terminals 64, 66 of a full-wave bridge rectifier D3. A first output terminal of the bridge rectifier D3 is coupled to a first terminal of an inductor L1 via a node 58. A second terminal of the inductor L is coupled to a drain of a transistor switch Q1 and to the anode of a diode D1. The cathode of the diode D1 is coupled to a first terminal of a bulk capacitor C3, which forms a PFC output node 56 that may further be coupled to a load (e.g., a DC-DC converter). As shown, a second output terminal of the bridge rectifier D3, the source of the transistor switch Q1, and the second terminal of the capacitor C3 may be coupled to ground. Furthermore, a PFC control circuit 54 may be coupled to the gate of the transistor switch Q1 through a node 60 to control whether the transistor switch Q1 is conductive (i.e., the switch is closed) or non-conductive (i.e., the switch is open). Additionally, the PFC control circuit 54 may be operable to sense various voltage and currents in the power converter. For example, the PFC control circuit 54 may be connected to a voltage divider circuit (i.e., resistors R1 and R2) through a node 62.

In operation, a current flows from the bridge rectifier D3 through the inductor L1 and through the switch Q1 when it is closed. Under such conditions, the diode D1 is reverse-biased by the voltage on the capacitor C3 (i.e., the PFC output node 56). The current flowing through the inductor L1 stores energy in the form of an electromagnetic field. When the switch Q1 is opened, the stored energy is transferred to the bulk capacitor C3 by a current that flows through the diode D1, which is forward-biased under such conditions. The energy in the bulk capacitor C3 maintains the voltage at the PFC output node 56 and is available for driving a load (e.g., another power supply stage). As can be appreciated, the rate of energy transfer from the AC power source 52 to the capacitor C3 is dependent upon a duty cycle of the transistor switch Q1. Therefore, using feedback voltage and current signals, the PFC control circuit 54 may control the times at which switching of the transistor switch Q1 occurs so that the AC current and the AC voltage are substantially in phase, and so that the PFC output node 56 voltage is substantially maintained at a constant DC level. As an example, the switching frequency of the transistor switch Q1 may be in the range of 10 kHz, 50 kHz, 250 kHz, and the like.

Figure 3:
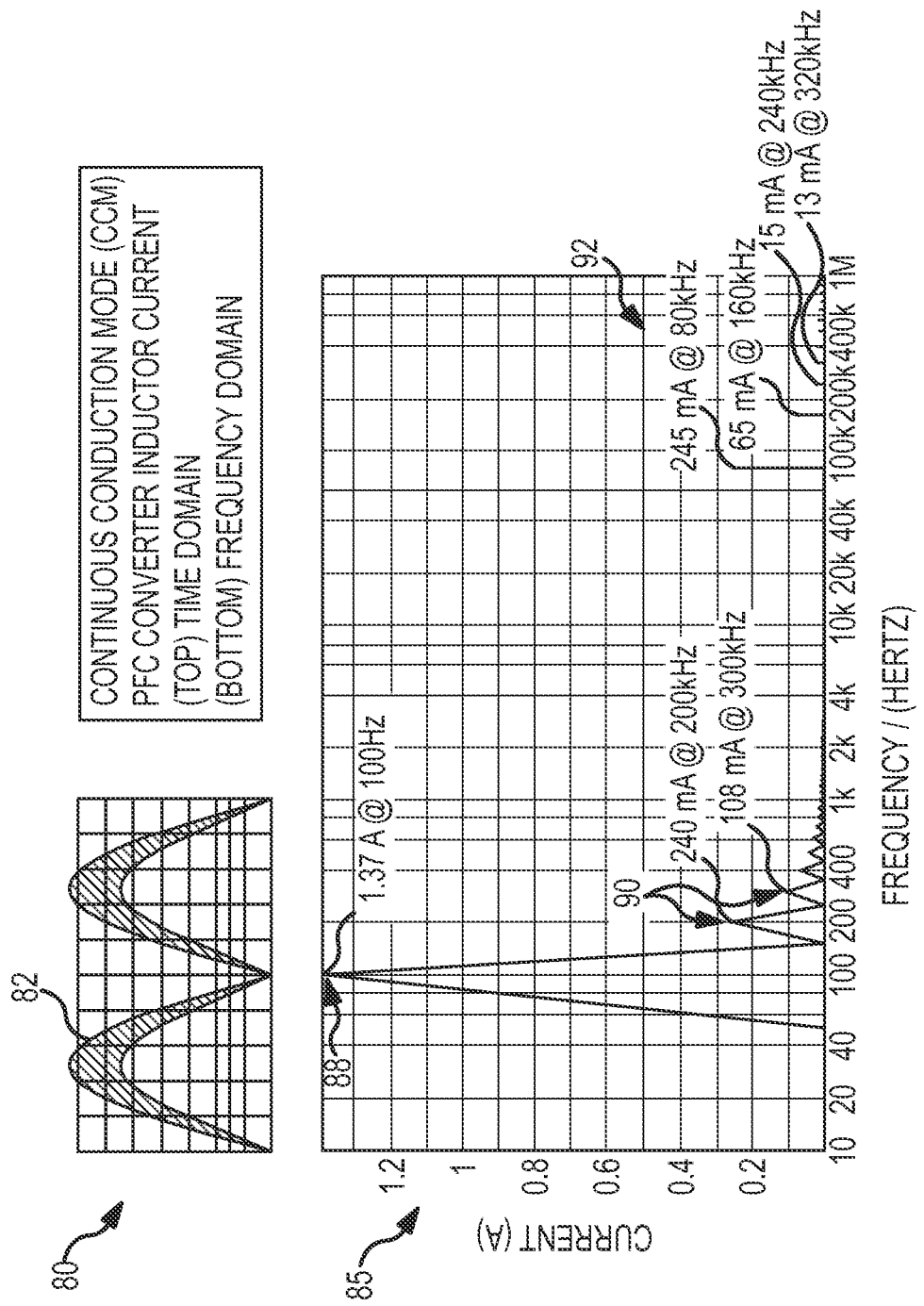
FIG. 3 illustrates time and frequency domain representations of the current through the inductor L1 shown in FIG. 2 when the PFC boost converter is operated in a Continuous Conduction Mode (CCM).
Figure 4:
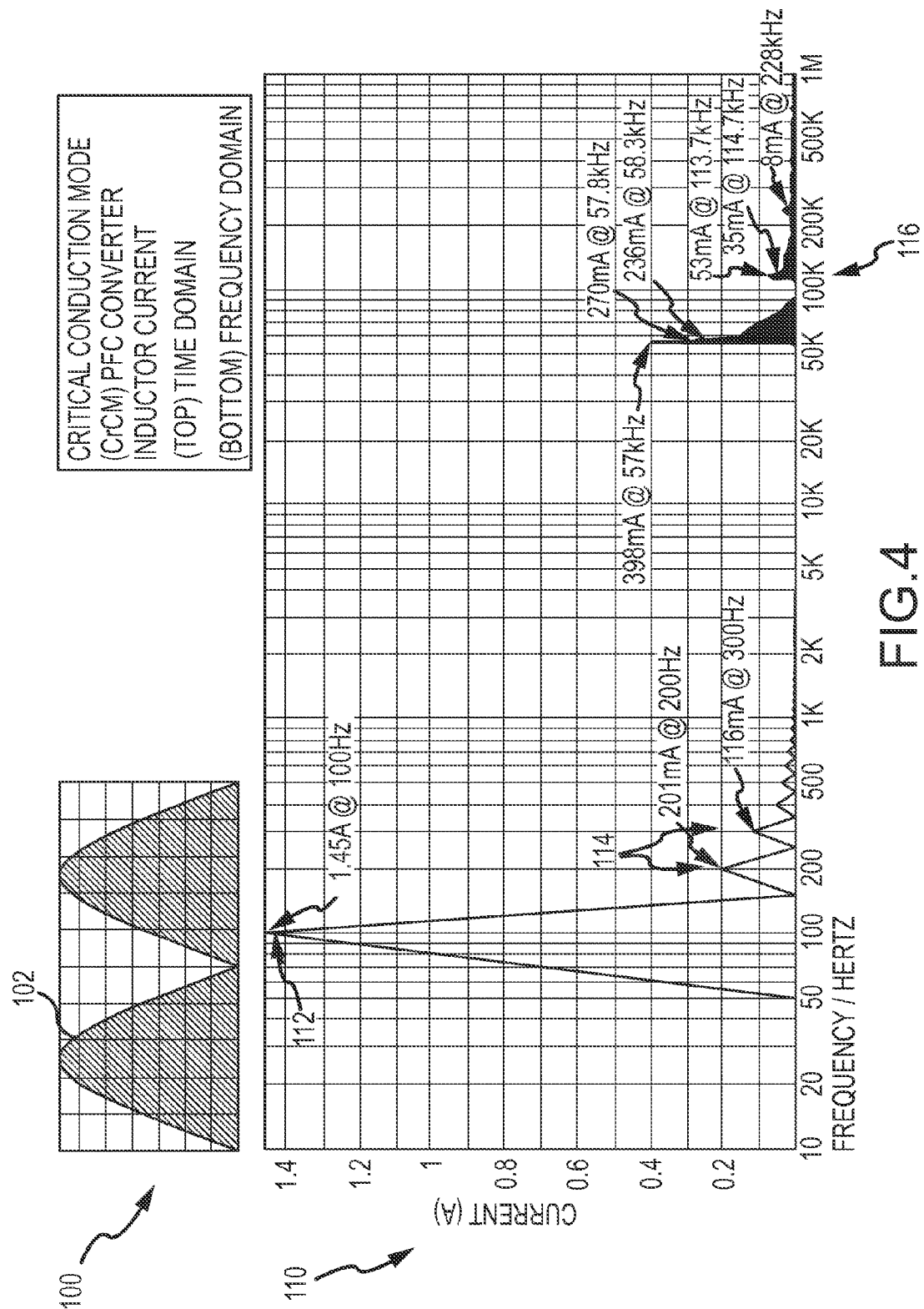
FIG. 4 illustrates time and frequency domain representations of the current through the inductor L1 shown in FIG. 2 when the PFC boost converter is operated in a Critical Conduction Mode (CrCM).

The PFC converter inductor L1 may carry large components of 2nd harmonic source frequency harmonics (e.g. 100 Hz or 120 Hz for 50 Hz and 60 Hz AC power sources, respectively), but may also carry significant components of relatively higher switching harmonics (e.g. 20 kHz-400 kHz, or higher). FIGS. 3 and 4 show typical PFC boost inductor current (time domain and frequency domain) for continuous-conduction-mode (FIG. 3) and critical-conduction-mode (FIG. 4) PFC converters. FIG. 3 illustrates a time domain graph 80 and a frequency domain graph 85 of the current flowing through the inductor L1 (e.g., inductor current 82 shown in the time domain graph 80). As referenced by the numerals 88 and 90, the majority of current passing through the PFC inductor L1 is low frequency such as 100 Hz and 200 Hz (or 120 Hz and 240 Hz for a 60 Hz AC power source). However, there is also a reasonably high percentage of switching-frequency currents (e.g., 50 kHz-500 kHz) in the PFC boost inductor L1, as highlighted by the reference numeral 92.

Similarly, FIG. 4 illustrates a time domain graph 100 and a frequency domain graph 110 of the current flowing through the inductor L1 (e.g., inductor current 102 shown in the time domain graph 100). As referenced by the numerals 112 and 114, the majority of current passing through the PFC inductor L1 is low frequency such as 100 Hz and 200 Hz (or 120 Hz and 240 Hz for a 60 Hz AC power source). However, there are also a reasonably high percentage of switching-frequency currents (e.g., 50 kHz-500 kHz) in the PFC boost inductor L1, as highlighted by the reference numeral 116.

Figure 5:
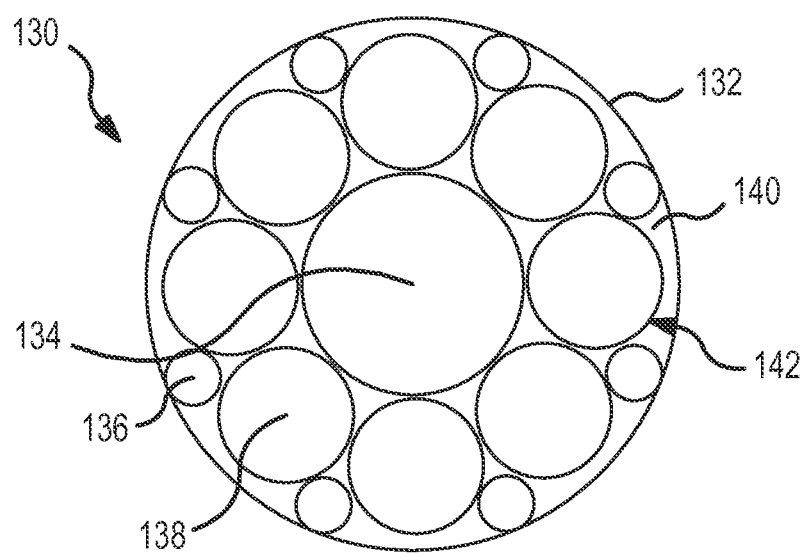
FIG. 5 illustrates a cross-sectional view of an exemplary optimized litz wire.

FIG. 5 illustrates a cross-sectional area an optimized litz (or bunched) wire 130 that may be used for a winding of a PFC inductor (such as the inductor L1) or any other application that may carry multiple harmonics. The wire 130 may include a relatively large conductive strand 134 disposed in the center, and a plurality of strands 136 and 138 disposed around the larger strand 134. Each of the strands 134, 136, and 138 may include an inner conductor made from any suitable conductive material (e.g., copper, silver, or the like). Further, each individual strand may be insulated from each other by an outer insulating layer (e.g., the outer insulating layer 142), which may be constructed from any suitable material, such as nylon, fiberglass, ceramic, plastics, or the like. Further, the entire wire 130 may include an outer insulation layer 132. It will be appreciated that since the various strands (e.g., strands 134, 136, and 136) have a circular cross-sectional area, the overall cross-sectional area of the litz wire 130 may include a plurality of "gaps" 140.

By utilizing multiple strands of wire having different cross sectional areas (or gauges), each gauge of wire may be designed and selected to carry current for one or more specific harmonics of the PFC inductor current. In this regard, the different gauges of wire may result in significantly fewer individual strands of litz wire, and thus, less insulation in comparison to the overall cross-sectional area of the wire 130. This feature may also increase the percentage of the cross-sectional area in the wire 130 that includes a conductor. Furthermore, the different wire gauges utilize the cross-sectional area better than equal wire gauges by reducing the amount of air space (e.g., gaps 140) in the cross-section of the wire 130.

In the exemplary embodiment shown in FIG. 5, the large conductive wire strand 134 in the center may carry the second-harmonic AC source frequency current (typically 100 Hz or 120 Hz for 50 Hz and 60 Hz AC sources, respectively), the mid-sized strands 138 that are closer to the outside of the wire 130 may carry the upper frequency harmonics of the AC source current (e.g. $4^{th}$ harmonic, $6^{th}$ harmonic, and the like), and the smallest strands 136 at the outer edge of the litz wire 130 may carry the switching frequency current (e.g., approximately 50 kHz-500 kHz). Additionally, by using different gauges of wire, more of the cross-sectional area of the wire 130 may be utilized by conductors, which permits the wire 130 to carry more current than a similarly sized litz wire using wires having a single gauge. As an example, conductors may make up over 80%, over 90%, or more of the overall cross-sectional area of the litz wire 130. It will be appreciated that the gauge selected for the various strands of the wire 130 may be chosen dependent upon the frequency and magnitude of the current intended for the application. In one embodiment, the center strand 134 may make up at least 50 percent of the total cross-sectional area of the conductors in the wire 130. Further, it will be appreciated that other numbers of different gauge wire may be used (e.g., two different gauges of wire, four different gauges of wire, and the like).

In addition, the multiple strands of different gauge wire may be arranged in any suitable pattern. For example, the strands 134, 136, and 138 may be twisted together in various ways (e.g., twelve twists per foot). Further, other patterns, such as a braid, may be utilized.

Figure 6:
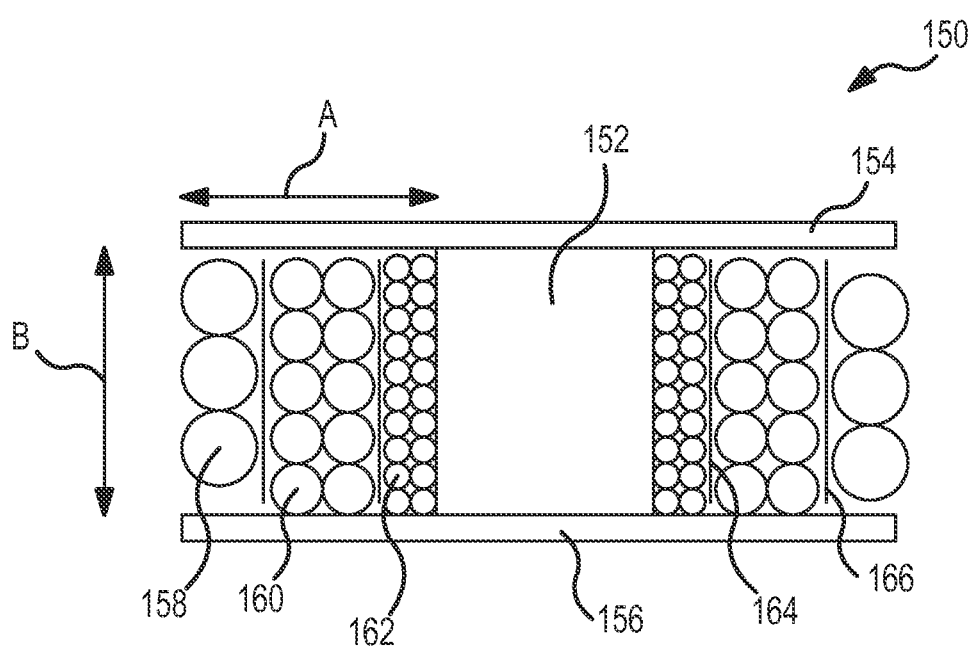
FIG. 6 illustrates a cross-sectional view of a bobbin that is wound with multiple strands of wires having different gauges.

FIG. 6 illustrates a cross-sectional view of a bobbin 150 that includes a spindle portion 152 and rim portions 154 and 156. The bobbin 150 may be used in conjunction with a core (e.g., an EE-core) to form a magnetic component, such as an inductor or a transformer. In this embodiment, three strands 158, 160, and 162 of wire having multiple cross-sectional areas (different gauges) are wound around the spindle of the bobbin 150. The ends of each strand 158, 160, and 162 are coupled together, such that the strands are connected to each other in parallel. In this regard, the smaller diameter wire 162 may be used to carry the higher frequency harmonics (e.g., the switching frequency current), while the larger diameter wires 160 and 158 may be used to carry the middle and lower frequency harmonics (e.g., the AC source frequency harmonics), respectively. Optionally, layers of insulation 164, 166 may be disposed between the strands 158, 160, and 162 to provide further electrical isolation.

In the example shown in FIG. 6, the spindle 152 and the rims 154, 156 of the bobbin 150 form a "window" (the area referenced by the arrows A and B) for the windings to be wrapped. It should be appreciated that the by utilizing multiple strands having different gauges, the portion of the window used to carry current at the various frequencies may be improved over previous designs that used multiple strands having the same gauge. Further, in general, the features described herein may reduce the losses in the windings of a magnetic component by reducing the portion of conductors that have a very low current density (due to the skin effect), by reducing the gaps between strands by providing strands of different gauges, and by reducing the percentage of total cross-sectional area that is occupied by the insulation layers of the individual strands. It will be appreciated that the features described herein may have other advantages as well.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed:

1. A power factor correction circuit for receiving an AC source current from an AC power source, wherein the AC source current has a plurality of electrical frequency harmonics including a second-harmonic, the power factor correction circuit comprising:
a switch Q1;
a rectifier that receives and rectifies the AC source current from the AC power source;
a controller electrically coupled with the switch Q1 for controlling the switch Q1; and
an inductive element electrically coupled with the switch Q1 and comprising a plurality of strands, each strand of the plurality of strands including an inner conductor and an outer insulating layer, wherein the cross-sectional area of each of the strands is based on the electrical frequency harmonics and at least one of the plurality of strands has a cross-sectional area that is different than a cross-sectional area of another of the plurality of strands, and further wherein one or more first strands of the plurality of strands each have a cross-sectional area based on the second-harmonic of the AC source current of the power factor correction circuit, wherein the one or more first strands are exactly one strand that has a cross-sectional area that is larger than the other of the plurality of strands, which all have the same cross-sectional area as each other, wherein the cross-sectional area of each of the other of the plurality of strands is based on one of a switching frequency of the switch Q1 or a third or greater harmonic of the electrical frequency harmonics of the AC source current.

2. The power factor correction circuit of claim 1, wherein the one strand is located near the center of the inductive element, and wherein the other of the plurality of strands are located away from the center of the inductive element.

3. The power factor correction circuit of claim 1, wherein the one strand has a cross-sectional area that is at least 50 percent of the total cross-sectional area of the inductive element.

4. The power factor correction circuit of claim 1, wherein the area of the other of the plurality of strands are chosen to fit an integral number of wires strands around the one strand.

5. The power factor correction circuit of claim 1, wherein the sum of the cross-sectional areas of the inner conductors is greater than 85 percent of the total cross-sectional area of the inductive element.

6. The power factor correction circuit of claim 1, wherein the plurality of strands include one or more second strands and one or more third strands, wherein the first, second and third strands have different cross-sectional areas, and further wherein the cross-sectional area of each of the second strands is based on a third or greater harmonic of the electrical frequency harmonics of the AC source current, and the cross-sectional area of each of the third strands is based on a switching frequency of the switch Q1.

7. The power factor correction circuit of claim 6, wherein the conductive cable includes an equal number of strands having a first cross-sectional area and a second cross-sectional area, wherein the first and second cross-sectional areas are different.

8. A method for providing a power factor correction circuit for receiving an AC source current from an AC power source, wherein the AC source current has a plurality of electrical frequency harmonics including a second-harmonic, the method comprising:
providing a switch Q1;
receiving and rectifying the AC source current from the AC power source with a rectifier;
controlling the switch Q1 with a controller electrically coupled with the switch Q1;
providing an inductive element electrically coupled with the switch Q1, wherein the providing of the inductive element comprises:
providing a first set of one or more strands each comprising an inner conductor and an outer insulating layer, the inner conductor having a first cross-sectional area;
providing a second set of one or more strands each comprising an inner conductor and an outer insulating layer, the inner conductor having a second cross-sectional area different than the first cross-sectional area, wherein the first and second cross-sectional areas are based on the electrical frequency harmonics of the AC source current, and further wherein the first cross-sectional area is based on the second-harmonic of the AC source current of the power factor correction circuit; and
coupling the ends of the first set of one or more strands and the second set of one or more strands together to form the inductive element; and
flowing the AC source current from the AC power source through the rectifier and through the strands of the inductive element, wherein the first set of one or more strands is exactly one strand, and wherein the first cross-sectional area is larger than the second cross-sectional areas of the second set of strands, which all have the same cross-sectional area as each other, wherein the cross-sectional area of each of the other of the plurality of strands is based on one of a switching frequency of the switch Q1 or a third or greater harmonic of the electrical frequency harmonics of the AC source current.

9. The method of claim 8, wherein the one strand is located near the center of the inductive element, and wherein the strands of the second set of one or more strands are located away from the center of the inductive element.

10. The method of claim 8, wherein the one strand has a cross-sectional area that is at least 50 percent of the total cross-sectional area of the inductive element.

11. The method of claim 8, further comprising:
wrapping the inductive element around at least a portion or a core to form a magnetic component.

12. The method of claim 8, wherein the sum of the cross-sectional areas of all of the inner conductors is greater than 85 percent of the total cross-sectional area of the inductive element.

13. The method of claim 8, further comprising:
providing a third set of one or more strands each comprising an inner conductor and an outer insulating layer, the inner conductor having a third cross-sectional area different than the first and second cross-sectional areas; and
coupling the ends of the first set of one or more strands, the second set of one or more strands, and the third set of one or more strands together to form the inductive element, wherein the second cross-sectional area is based on a third or greater harmonic of the electrical frequency harmonics of the AC source current, and the third cross-sectional area is based on a switching frequency of the switch Q1.

14. The method of claim 13, wherein the first set of one or more strands has an equal number of strands as at least one of the second and third set of strands.

15. A power factor correction circuit for receiving an AC source current from an AC power source, wherein the AC source current has a plurality of electrical frequency harmonics, the power factor correction circuit comprising:
- a switch Q1;
- a rectifier that receives and rectifies the AC source current from the AC power source;
- a controller electrically coupled with the switch Q1 for controlling the switch Q1; and
- an inductive element electrically coupled with the switch Q1 and comprising:
  - a core; and
  - a conductive cable carrying current having a plurality of electrical frequency harmonics and wrapped around at least a portion of the core, the conductive cable comprising a plurality of strands each of the plurality of strands including an inner conductor and an outer insulating layer, wherein the strands have cross-sectional areas matched to the electrical frequency harmonics and at least one of the plurality of strands has a cross-sectional area that is different than a cross-sectional area of another of the plurality of strands;

wherein the plurality of strands include one or more first strands, one or more second strands and one or more third strands, wherein the first, second and third strands have different cross-sectional areas, and further wherein the cross-sectional area of the first strands is based on a second-harmonic of the AC source current, the cross-sectional area of the second strands is based on a third or greater harmonic of the AC source current, and the cross-sectional area of the third strands is based on a switching frequency of the switch Q1.

16. The power factor correction circuit of claim 15, wherein the inductive element is a transformer or an inductor.

* * * * *